United States Patent
Caffee

(10) Patent No.: US 10,355,642 B2
(45) Date of Patent: Jul. 16, 2019

(54) COMB TERMINALS FOR PLANAR INTEGRATED CIRCUIT INDUCTOR

(71) Applicant: Silicon Laboratories Inc., Austin, TX (US)

(72) Inventor: Aaron J. Caffee, Scappoose, OR (US)

(73) Assignee: Silicon Laboratories Inc., Austin, TX (US)

( * ) Notice: Subject to any disclaimer, the term of this patent is extended or adjusted under 35 U.S.C. 154(b) by 448 days.

(21) Appl. No.: 14/722,607

(22) Filed: May 27, 2015

(65) Prior Publication Data

US 2016/0351309 A1   Dec. 1, 2016

(51) Int. Cl.
| | |
|---|---|
| *H01F 27/28* | (2006.01) |
| *H01F 27/29* | (2006.01) |
| *H03B 5/00* | (2006.01) |
| *H01F 17/00* | (2006.01) |

(52) U.S. Cl.
CPC ............ *H03B 5/00* (2013.01); *H01F 17/0013* (2013.01); *H01F 2017/0073* (2013.01); *H01F 2017/0086* (2013.01); *H03B 2200/0016* (2013.01)

(58) Field of Classification Search
USPC .................... 336/180, 223, 225, 198, 192
See application file for complete search history.

(56) References Cited

U.S. PATENT DOCUMENTS

| | | | | |
|---|---|---|---|---|
| 4,636,754 A | * | 1/1987 | Presser | ............... H01P 5/186 333/116 |
| 5,410,179 A | * | 4/1995 | Kornrumpf | ........... H01F 41/045 257/638 |
| 7,141,883 B2 | | 11/2006 | Wei et al. | |
| 7,236,024 B2 | | 6/2007 | Huang et al. | |
| 7,310,039 B1 | | 12/2007 | Zhang | |
| 7,498,656 B2 | | 3/2009 | Zhang et al. | |
| 7,501,924 B2 | | 3/2009 | Zhang | |
| 7,825,764 B2 | * | 11/2010 | Feldtkeller | .......... H01F 17/0013 336/147 |
| 8,648,664 B2 | | 2/2014 | Eldredge et al. | |
| 2004/0222478 A1 | | 11/2004 | Zhang et al. | |
| 2004/0222511 A1 | | 11/2004 | Zhang | |
| 2005/0269668 A1 | | 12/2005 | Zhang | |
| 2007/0139154 A1 | * | 6/2007 | Aoki | ................... H01F 17/0006 336/223 |

* cited by examiner

*Primary Examiner* — Elvin G Enad
*Assistant Examiner* — Kazi S Hossain
(74) *Attorney, Agent, or Firm* — Zagorin Cave LLP

(57) ABSTRACT

A technique for reducing series resistance of an inductor system, which may increase the quality factor of the inductor system, has been disclosed. An apparatus includes a conductive loop formed from a first conductive layer. The conductive loop comprises a first terminal and a second terminal. The first terminal includes at least one first conductive finger in the first conductive layer. The second terminal includes at least one second conductive finger in the first conductive layer. The at least one second conductive finger is interdigitated with the at least one first conductive finger without directly contacting the at least one first conductive finger. The apparatus may include a serpentine gap in the first conductive layer. The apparatus may include at least one first conductive via coupled to a second conductive layer and coupled the at least one first conductive fingers, respectively.

20 Claims, 4 Drawing Sheets

COMB TERMINALS FOR PLANAR INTEGRATED CIRCUIT INDUCTOR

BACKGROUND

Field of the Invention

The present application is directed to integrated circuits and in particular to integrated circuits including inductors.

Description of the Related Art

In general, electronic oscillator circuits are used to generate repetitive oscillating electronic signals. A conventional tank circuit (i.e., an LC oscillator circuit) is a tuned circuit including an inductor coupled to a capacitor. Charge flows back and forth from the capacitor plates through the inductor so the tuned circuit can store electrical energy oscillating at its resonant frequency. An amplifier circuit compensates for small losses in the tank circuit to sustain oscillation. In general, the quality factor, Q, characterizes a resonator's bandwidth relative to its center frequency. Referring to FIG. 1, the quality factor of a typical parallel tank circuit may be represented as $Q=1/(\omega_o L_{TANK} G_{loss})$, where $\omega_o$ is the resonant angular frequency of the tank circuit, $L_{TANK}$ is the inductance, and $G_{loss}$ represents the conductive losses due to the inductor, the capacitor, and amplifier loading. A higher Q indicates a lower rate of energy loss relative to the stored energy of the resonator, i.e., oscillations die out more slowly. By supplying a transconductance, $-G_m$, that is equal and opposite to the tank losses ($G_{loss}$), the amplifier is able to sustain oscillation indefinitely at the resonant frequency of the tank and at an amplitude determined by the amplifier.

SUMMARY OF EMBODIMENTS OF THE INVENTION

A technique for reducing series resistance of an inductor system, which may increase the quality factor of the inductor system, has been disclosed. In at least one embodiment of the invention, an apparatus includes a conductive loop formed from a first conductive layer. The conductive loop comprises a first terminal and a second terminal. The first terminal includes at least one first conductive finger in the first conductive layer. The second terminal includes at least one second conductive finger in the first conductive layer. The at least one second conductive finger is interdigitated with the at least one first conductive finger without directly contacting the at least one first conductive finger. The apparatus may include a serpentine gap in the first conductive layer. The serpentine gap may be disposed between the first terminal and the second terminal and may have a constant width. The apparatus may include at least one first conductive via coupled to a second conductive layer and coupled the at least one first conductive finger, respectively. The apparatus may include at least one second conductive via coupled to the second conductive layer and coupled to the at least one second conductive finger, respectively. The first conductive layer may be thicker than the second conductive layer. The first conductive layer may have a lower resistivity than the second conductive layer. The apparatus may include conductive structures formed in the second conductive layer.

In at least one embodiment of the invention, a method of manufacturing an integrated circuit includes forming a first conductive layer above a substrate. The method includes forming a conductive loop from the first conductive layer. The conductive loop includes a first terminal and a second terminal. The first terminal includes at least one first conductive finger. The second terminal includes at least one second conductive finger. The at least one second conductive finger is interdigitated with the at least one first conductive finger without directly contacting the at least one first conductive finger. Forming the conductive loop may include forming a serpentine gap having a constant width in the first conductive layer and being disposed between the first terminal and the second terminal. The method may include forming a second conductive layer above the substrate. The second conductive layer may be disposed between the substrate and the first conductive layer. The method may include forming at least one first conductive via coupled to a second conductive layer and coupled to the at least one first conductive finger, respectively. The method may include forming at least one second conductive via coupled to the second conductive layer and coupled to the at least one second conductive finger, respectively. The first conductive layer may have a resistivity less than the resistivity of the second conductive layer.

In at least one embodiment of the invention, an apparatus includes a conductive loop formed from a first conductive layer above a substrate. The conductive loop includes a first terminal and a second terminal. The conductive loop includes a serpentine gap in the first conductive layer. The serpentine gap is formed between the first terminal and the second terminal. The apparatus may include at least one first conductive via coupled to a second conductive layer and coupled to the first terminal. The apparatus may include at least one second conductive via coupled to the second conductive layer and coupled to the second terminal. The first conductive layer may have a lower resistivity than the second conductive layer.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DETAILED DESCRIPTION

Figure 1:
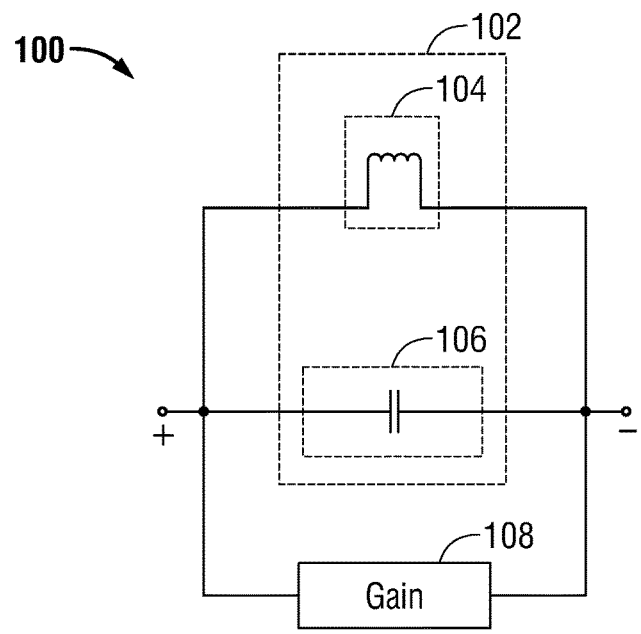
FIG. 1 illustrates an exemplary schematic/block diagram of an exemplary LC oscillator circuit in accordance with an embodiment of the invention.

Referring to FIG. 1, an integrated circuit die includes an LC oscillator circuit e.g., circuit 100, including inductor 104 and capacitor 106, which form tank circuit 102, and gain stage 108. The quality factor associated with the resonant circuit (i.e., $Q_{RESONANT}$) describes the ability of the circuit to produce a large output at a resonant frequency and also describes the selectivity of the circuit. The $Q_{RESONANT}$ may be substantially affected by the quality factor of an inductor (i.e., $Q_L$) included in the resonant circuit. In general, $Q_L$ for an inductor modeled as an inductance in series with a resistance is $$Q_L = \frac{\omega L}{R}$$

where ω is the angular frequency of oscillation, L is the inductance of the inductor, and R is the effective series resistance of the inductor. As resistance of the conductive loop increases, $Q_L$ decreases. Higher Q systems dissipate less power and result in increased battery life than lower Q systems in portable applications.

In general, an inductor includes an input, an output, and a coil disposed therebetween through which current rotates. The coil introduces inductance into an electrical circuit, to produce magnetic flux. As referred to herein, a coil is a conductor having at least a fractional number of turns around a core region of space. An individual turn of an exemplary coil may be defined by a curve traced by the tip of a position vector, e.g., R(t)=x(t)i+y(t)j+z(t)k from t=a to t=b. As referred to herein, one full turn of the coil is defined by a portion of the curve as t runs from 0 to 2π. However, an exemplary coil may make any number of full turns or fractional turns. For example, less than one full turn, i.e., R(t) for 0<t<2π, may form the coil. Small inductors with a good quality factor ($Q_L$) have been very difficult to design given modern integrated circuit design restrictions. Traditionally, integrated circuit inductors are designed to be metal traces forming planar loops (e.g., spiral inductors).

Figure 2:
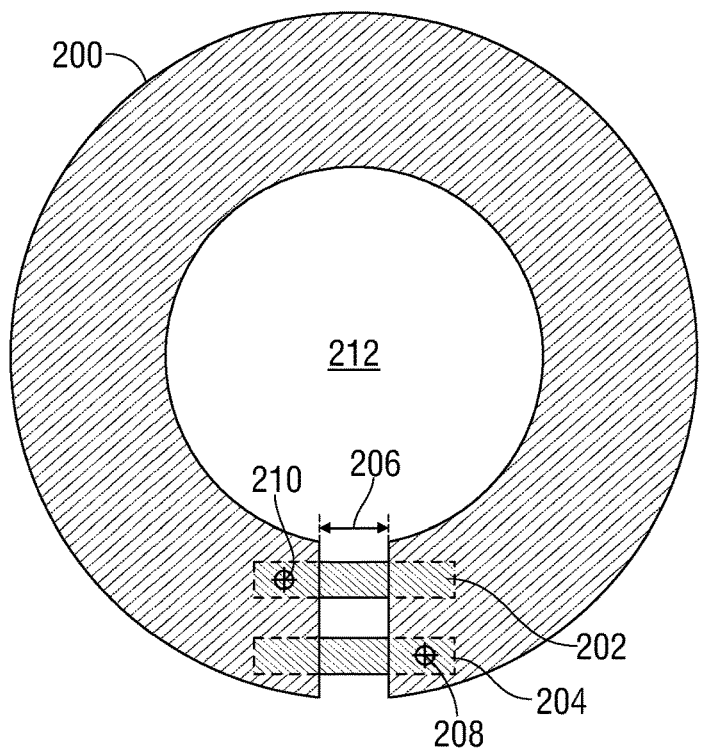
FIG. 2 illustrates a top view of an exemplary planar inductor structure.

Referring to FIG. 2, an exemplary integrated circuit inductor includes conductive loop 200, which is a planar loop formed from a conductive layer disposed above semiconductor substrate 212. In general, since inductance is a function of area, and equivalent series resistance tends to be a function of perimeter under low substrate-loss conditions (e.g., high substrate resistivity below the inductor), a loop-shaped conductor is used to implement the inductor to maximize the ratio of inductance to resistance. The loop shape of the conductor results in the greatest cross-sectional area to perimeter ratio for the inductor and thus, maximizes Q of the inductor.

Figure 3:
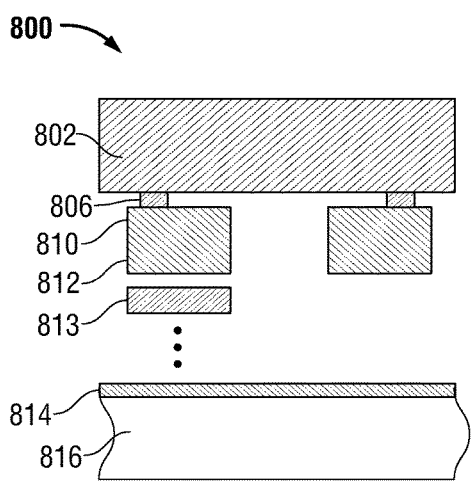
FIG. 3 illustrates a cross-sectional view of a portion of an inductor structure formed above a substrate consistent with at least one embodiment of the invention.

Referring to FIGS. 2 and 3, conductive loop 200 is formed in conductive layer 802. Conductive layer 802 has low resistivity and may be a topmost metal layer in an integrated circuit manufacturing process. In at least one embodiment, conductive layer 802 is an ultra-thick layer formed above semiconductor substrate 816. In general, an ultra-thick layer may include dielectric and conductive layers formed on an integrated circuit substrate below any passivation layer and below any integrated circuit bonding pads, if present. However, an ultra-thick layer may be formed on an integrated circuit die in the absence of a passivation layer or bonding pads. Ultra-thick layers typically have thicknesses substantially greater than the thicknesses of typical dielectric and conductive layers formed in lower layers of an integrated circuit stack. For example, typical conductive layer 814 of an integrated circuit is less than 1 μm thick. However, conductive layer 802 in an exemplary ultra-thick conductive layer is at least 3.3 μm thick and corresponding dielectric layers are at least 0.65 μm thick. Ultra-thick dielectric layers may include silicon nitride, oxynitride, silicon oxide, or other suitable materials. Ultra-thick conductive layers may include aluminum, copper, polysilicon, or other suitable conductive materials.

In at least one embodiment of the present invention, an ultra-thick conductive layer is separated from traditional integrated circuit layers (e.g., typical conductor layers 814 and 813) by a transitional layer or layers that improve manufacturability. Transitional conductive layer 810 has a thickness less than a thickness of the ultra-thick conductive layer, but greater than a thickness of traditional conductive layer 813 or traditional conductive layer 814. Transitional layers may include a thick conductive layer and a thick dielectric layer and may be formed of any suitable material (e.g., silicon nitride, oxynitride, silicon oxide, aluminum, copper, polysilicon). A typical manufacturing technology uses few ultra-thick conductive layers and limits those layers to top metallization layers. A typical ultra-thick conductive layer is formed from a conductive material (e.g., 3 μm thick copper) that has a higher conductivity than the conductive material forming lower conductive layers (e.g., 1 μm thick transitional layer formed from aluminum).

In general, typical integrated circuit manufacturing processes do not stack multiple ultra-thick conductive layers due to manufacturability issues (e.g., stresses causing delamination). Accordingly, the next adjacent conductive layer beneath the ultra-thick conductive layer typically has lower thickness and/or is formed from a different material, which results in the next adjacent conductive layer having a higher resistivity than the conductive layer used to form conductive loop 200. However, the physical design of conductive loop 200 and associated connectivity structures result in a substantial amount of current routing in the next adjacent conductive layer, which increases the resistance in series with conductive loop 200 and impacts (e.g., reduces) the Q of the resulting system.

Conductors formed in transitional conductive layer 810 may be used to form one or more capacitors. The one or more capacitors may include transistor capacitors and may be formed in the active area of the integrated circuit along with the one or more amplifiers. The one or more capacitors may be other integrated circuit capacitors, e.g., "finger" capacitors, formed by a plurality of densely-spaced, substantially parallel metal lines, i.e., "fingers." Alternating ones of the fingers are coupled to form the plates of the capacitor. A capacitor or other integrated circuit element coupled to the inductor may be formed in any combination of conductive layers on the integrated circuit and coupled by conductive vias to any suitable portion of inductor 200 to provide any suitable current path.

Ideally, conductive loop 202 is not coupled in series with any resistance. However, since the material of the ultra-thick conductive layer has a finite conductivity and lower conductive layers of the integrated circuit have lower conductivity than the ultra-thick layer (e.g., due to smaller thicknesses and/or use of lower conductivity materials), electrically coupling the inductor to other integrated circuit elements using those lower layers may substantially increase the resistance in series with conductive loop 200 and thus, reduces the Q of the associated inductor system.

Still referring to FIG. 2, conductive loop 200 includes a gap in the conductive material to facilitate establishing current in conductive loop 200, e.g., using terminals of conductive loop 200 to couple conductive loop 200 to an associated circuit, typically formed below the inductor. For example, one or more capacitors and/or one or more amplifiers are coupled in parallel to conductive loop 200. In at least one embodiment of conductive loop 200, gap 206 has an approximately constant width and conductors 202 and 204 are formed in a conductive layer beneath conductive loop 200 and are coupled to conductive loop 200 by conductive via 210 and conductive via 208, respectively. Although each of conductive via 210 and conductive via 208 is illustrated as an individual conductive via, multiple conductive vias may be used to reduce the series resistance of each corresponding conductive via. In at least one embodiment, conductor 202 and conductor 204 form plates of a parallel plate capacitor. Conductor 202 is coupled to a first terminal (e.g., a positive terminal) of loop 200 by conductive via 210 and conductor 204 is coupled to a second terminal (e.g., a negative terminal) of conductive loop 200 by conductive via 208.

In at least one embodiment of an inductive system, rather than forming a parallel plate capacitor, conductor 202 and conductor 204 have comb geometries that form finger capacitors. For example, conductor 202 includes a comb structure including conductive fingers that are interdigitated, but not in physical contact with conductive fingers of a comb structure of conductor 204. Conductors 202 and 204 are formed in a transitional layer or traditional integrated circuit layers (described above) beneath the ultra thick conductor layer of loop 200.

Figure 4:
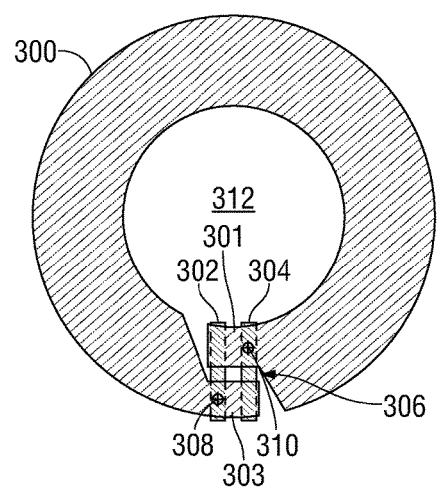
FIG. 4 illustrates a top view of an exemplary planar inductor structure consistent with at least one embodiment of the invention.

A technique for distributing current more effectively and reducing the series resistance of the inductive system includes increased routing in the conductive layer including the conductive loop. Forming two or more conductive fingers in the ultra-thick conductive layer of the inductor increases the edges of the conductive loop, thereby reducing effects of current crowding. The conductive fingers may form a comb-like conductive terminal structure. Conductors formed below the inductor may extend in a direction orthogonal to the ultra-thick conductive fingers of the inductor terminals and form a more robust electrical connection between one or more capacitors and the conductive loop forming the inductor. For example, referring to FIG. 4, conductive loop 300 includes terminal 301 including a first conductive finger extending approximately tangentially to an inner circumference of the conductive loop and in parallel to a second conductive finger of terminal 303. Accordingly, terminal 301 and terminal 303 form an irregular gap in conductive loop 300. The geometry of terminals 301 and 303 form gap 306 between terminals 301 and 303. For example, gap 306 may have a zigzagged or serpentine shape. Such geometry increases the routing of current in the conductive layer of the conductive loop (e.g., the ultra-thick conductive layer) and reduces the routing of current in other higher resistivity layers (e.g., the transitional conductive layer beneath the ultra-thick conductive layer or other higher resistivity conductive layers) below the loop. Terminals 301 and 303 are coupled to conductive vias 310 and 308, respectively, which couple terminals 301 and 303 to conductors 304 and 302, respectively, in the lower conductive layer. Conductors 304 and 302 are formed in a conductive layer beneath the conductive layer including loop 300. Conductors 304 and 302 may form a parallel plate capacitor or finger capacitors and may require current to travel a shorter distance in the higher resistivity material than that of conductors 202 and 204 of FIG. 2. Conductors 304 and 302 are disposed approximately radially with respect to a center of the conductive loop and accordingly may disrupt current flow less than the approximately tangential conductors of FIG. 2.

In at least one embodiment, additional conductors 302 and conductors 304 are included and may be disposed in alternating positions and are connected to respective terminals of loop 300 using multiple conductive vias 308 and 310. Current crowding is a nonhomogenous distribution of current density through the conductor. Current tends to aggregate at the edges of the conductor, e.g., at the inside and outside perimeters, and in the vicinity of the contacts. Such current crowding limits a usable cross sectional area of the conductor, increases series resistance, and is frequency dependent.

Thus, the geometry of terminals 301 and 303 and interconnections to conductors 302 and 304 reduces the series resistance of the system including conductive loop 300, as compared to the series resistance of the system including conductive loop 200 of FIG. 2. For example, current routing of 100 μm in conductors below conductive loop 200 is routed only over 10 μm in conductors below conductive loop 300, resulting in a reduction in series resistance by approximately one order of magnitude. Note that although the use of interdigitated conductive fingers may reduce $Q_L$ of the inductor and would not be a design choice made for a high-Q inductor alone, the corresponding reduction in series resistance of the overall inductive system has a greater effect on the system Q than on $Q_L$ and results in a net increase in the Q of a system including conductive loop 200.

Figure 5:
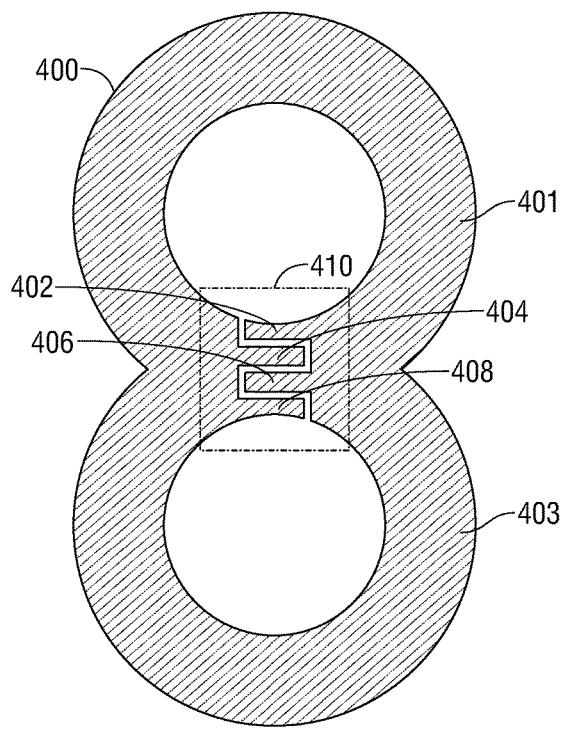
FIG. 5 illustrates a top view of an exemplary dual-loop inductor structure consistent with at least one embodiment of the invention.

In general, $Q_{RESONANT}$ of a resonant circuit is inversely related to interference from external sources. A technique for reducing the effect of electromagnetic interference on an inductor structure includes implementing the inductor structure using a two-loop arrangement. Referring to FIG. 5, in at least one embodiment, an inductor is formed using two parallel-connected conductive loops (e.g., conductive loop 401 and conductive loop 403). The two-loop arrangement is less susceptible to external electromagnetic interference (e.g., far field interference sources in particular) because induced current flow in one such coil (e.g., conductive loop 401 or conductive loop 403) is offset by an opposite current flow induced in the other coil (e.g., conductive loop 403 or conductive loop 401, respectively). In at least one embodiment, a terminal of a conductive loop (e.g. conductive loop 300 illustrated in FIG. 4 or a terminal of a two-loop arrangement of conductive loop 400 illustrated in FIG. 4) includes a conductive comb structure having at least two conductive fingers (e.g., conductive finger 402 and conductive finger 406) interdigitated with, but without direct physical contact to, corresponding conductive fingers (e.g., conductive finger 404 and conductive finger 408) of a conductive comb structure of a second terminal. The interdigitated conductive fingers are spaced apart to form a gap that may have a constant width and a serpentine or zigzagged shape. The interdigitated conductive fingers may be spaced apart to form a gap having a varying width and a serpentine or zigzagged shape. In at least one embodiment, the interdigitated conductive fingers themselves have varying widths and may form a gap having a varying width. The gap may be filled with a dielectric material (e.g., oxide, nitride, or other suitable electrically insulating material) or gas (e.g., air). The gap may be as small as manufacturability design rules allow, e.g., on the order of the thickness of the conductive layer in which the gap is formed or up to ten times the minimum spacing allowed by the manufacturability design rules.

Figure 6:
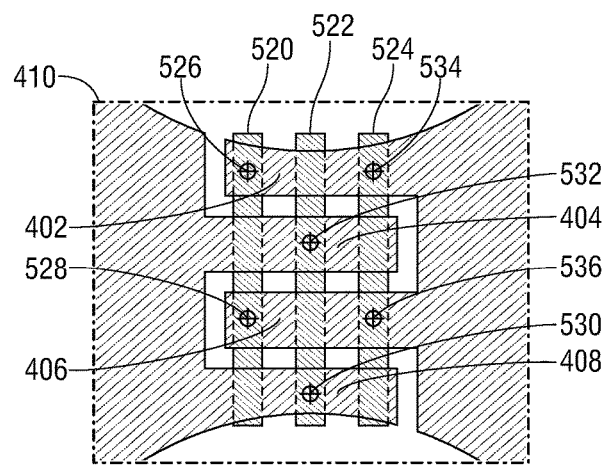
FIG. 6 illustrates a detailed view of terminals of the exemplary dual-loop inductor structure of FIG. 5 consistent with at least one embodiment of the invention.

FIG. 6 illustrates a detailed view of region 410 of the conductive dual-loop arrangement of FIG. 5. The detailed view also illustrates the conductors formed in a conductive layer beneath the conductive layer including the conductive loops. Conductors 520 and 524 are coupled to conductive fingers of a first terminal of the conductive loops by conductive vias 526, 528, 534, and 536. Conductor 522 is coupled to conductive fingers of a second terminal by conductive vias 530 and 532. Note that other embodiments include other numbers of conductive fingers of the loops, conductive vias, and conductors in a layer with lower conductivity than the layer of the loop. The other numbers of conductive fingers may be at different angles with respect to the conductive loops and may have different widths. In addition, other numbers of conductive loops may be coupled in parallel or series to form an inductor structure having a target inductance.

Although a circular conductive loop has a target area to perimeter ratio, manufacture of circular loops may not be practicable in typical integrated circuit manufacturing technologies. Accordingly, a circular conductive loop may be approximated by physical designs of conductive loops having other geometries. For example, referring to FIGS. 7 and 8, conductive loop 600 and conductive loop 700, having an octagonal shape and a rectangular shape, respectively, may be realized in manufacturing technologies that allow for formation of conductive lines forming angles in multiples of 45 degrees and only 90 degrees, respectively. However, note that other geometric shapes may be used.

Figure 7:
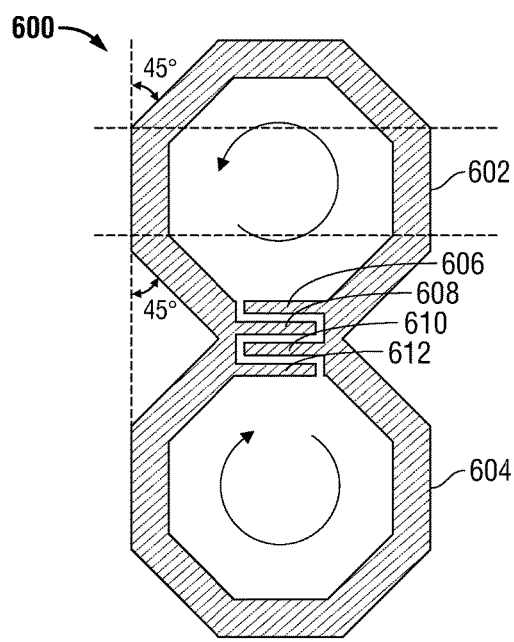
FIG. 7 illustrates an exemplary parallel dual-loop inductor structure for manufacture according to design rules of an integrated circuit manufacturing process consistent with at least one embodiment of the invention.
Figure 8:
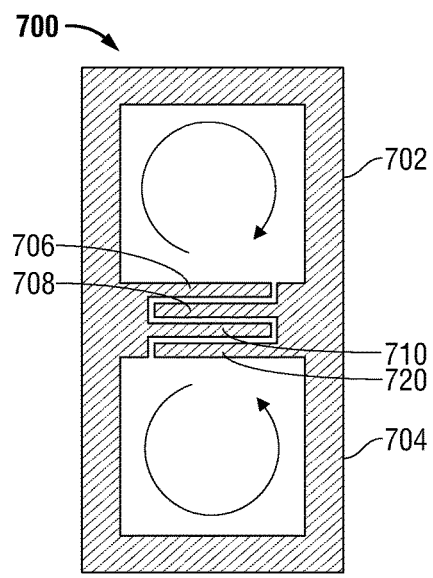
FIG. 8 illustrates an exemplary parallel dual-loop inductor structure for manufacture according to design rules of an integrated circuit manufacturing process consistent with at least one embodiment of the invention.
Figure 9:
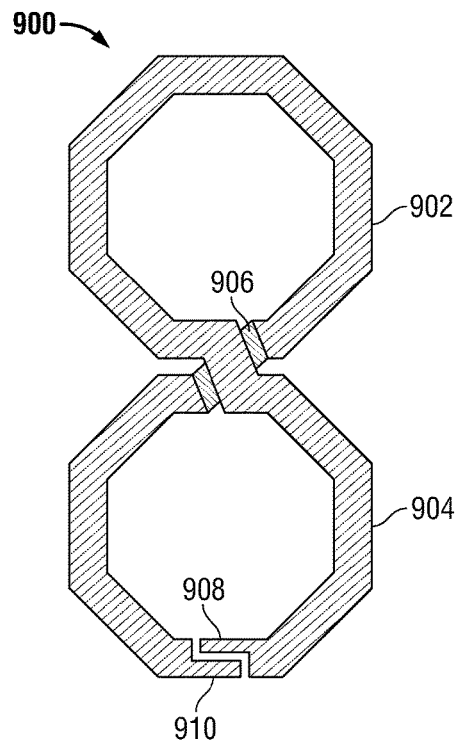
FIG. 9 illustrates an exemplary series dual-loop inductor structure for manufacture according to design rules of an integrated circuit manufacturing process consistent with at least one embodiment of the invention.

In at least one embodiment of a conductive loop, rather than forming a parallel conductive dual-loop arrangement that couples the two loops in parallel, as illustrated in FIGS. 7 and 8, the two loops are coupled in series. Referring to FIG. 9, conductive dual-loop arrangement 900 includes conductive loop 902 series coupled to conductive loop 904. Conductive loop 902 and conductive loop 904 may be formed in a top-most conductive layer (e.g., an ultra-thick conductive layer) and conductor portion 906 may be formed in a conductive layer (e.g., a transitional conductive layer) beneath the conductive layer including conductive loop 902 and conductive loop 904. The terminals of the conductive loop are disposed at one end of the dual-loop arrangement. For example, conductive fingers 908 and 910 are disposed at an end farthest from the conductor portion 906 although conductive fingers 908 and 910 may be disposed in different locations on conductive loop 902 or conductive loop 904. The exemplary series dual-loop arrangement may increase the inductance by approximately four times the inductance of a similar parallel dual-loop arrangement of FIG. 7.

In at least one embodiment, a terminal of a conductive loop (e.g. conductive loop 300 illustrated in FIG. 4 or a terminal of a two-loop arrangement of conductive loop 400 illustrated in FIG. 4) includes a conductive comb structure having at least two conductive fingers (e.g., conductive finger 402 and conductive finger 406) interdigitated with, but without direct physical contact to, corresponding conductive fingers (e.g., conductive finger 404 and conductive finger 408) of a conductive comb structure of a second terminal.

Figure 10:
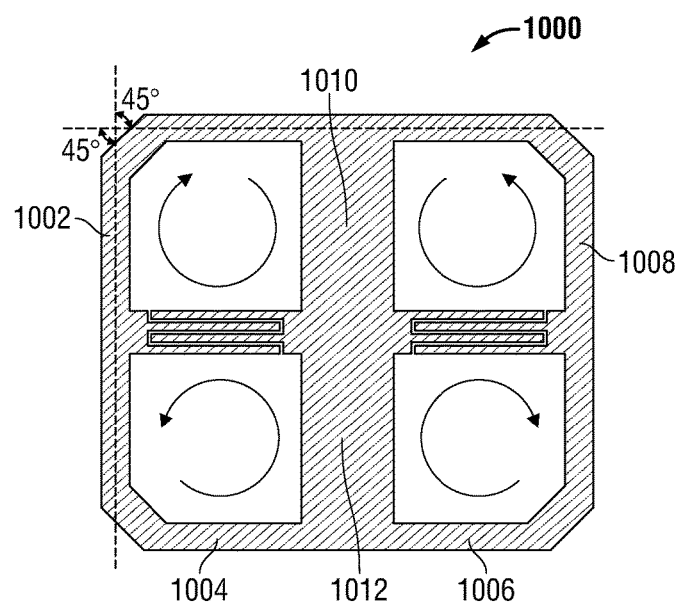
FIG. 10 illustrates an exemplary multi-loop inductor structure for manufacture according to design rules of an integrated circuit manufacturing process consistent with at least one embodiment of the invention.

In at least one embodiment of a conductive loop, additional loops may be used to realize a target inductance for a particular application. For example, referring to FIG. 10, conductive structure 1000 includes two dual-loop conductive structures coupled in parallel with each other. Shared portions 1010 and 1012 combine currents of conductive loops 1002 and 1008 and conductive loops 1004 and 1006, respectively. Currents flowing in conductive loop 1002 and conductive loop 1008 rotate in opposite directions and currents flowing in conductive loop 1004 and conductive loop 1006 rotate in opposite directions thereby reducing susceptibility to electromagnetic interference.

Thus various embodiments of conductive loops that reduce the series resistance of an inductive circuit have been disclosed. While circuits and physical structures have been generally presumed in describing embodiments of the invention, it is well recognized that in modern semiconductor design and fabrication, physical structures and circuits may be embodied in computer-readable descriptive form suitable for use in subsequent design, simulation, test or fabrication stages. Structures and functionality presented as discrete components in the exemplary configurations may be implemented as a combined structure or component. Various embodiments of the invention are contemplated to include circuits, systems of circuits, related methods, and tangible computer-readable medium having encodings thereon (e.g., VHSIC Hardware Description Language (VHDL), Verilog, GDSII data, Electronic Design Interchange Format (EDIF), and/or Gerber file) of such circuits, systems, and methods, all as described herein, and as defined in the appended claims. In addition, the computer-readable media may store instructions as well as data that can be used to implement the invention. The instructions/data may be related to hardware, software, firmware or combinations thereof.

The description of the invention set forth herein is illustrative, and is not intended to limit the scope of the invention as set forth in the following claims. For example, while the invention has been described in an embodiment in which an integrated circuit inductor is included in an oscillator circuit, one of skill in the art will appreciate that the teachings herein can be utilized with integrated circuit inductors formed as part of a filter circuit, a low-noise amplifier circuit, integrated transducers for sensor applications, isolation applications, or other circuit including an inductor on an integrated circuit. Variations and modifications of the embodiments disclosed herein, may be made based on the description set forth herein, without departing from the scope and spirit of the invention as set forth in the following claims.

What is claimed is:

1. An apparatus comprising:
   a conductive loop formed from a first conductive layer, the conductive loop comprising a first terminal and a second terminal,
   the first terminal comprising at least one first conductive finger in the first conductive layer,
   the second terminal comprising at least one second conductive finger in the first conductive layer, the at least one second conductive finger being interdigitated with the at least one first conductive finger without directly contacting the at least one first conductive finger;
   at least one first conductive via coupled to a second conductive layer and coupled to the at least one first conductive finger, respectively;
   at least one second conductive via coupled to the second conductive layer and coupled to the at least one second conductive finger, respectively;

a first conductive structure formed in the second conductive layer and coupled to the at least one first conductive via; and a second conductive structure formed in the second conductive layer and coupled to the at least one second conductive via, wherein the first conductive structure and the second conductive structure are parallel conductive lines extending approximately radially with respect to a center of the conductive loop.

2. The apparatus as recited in claim 1, wherein the first conductive layer is thicker than the second conductive layer.

3. The apparatus as recited in claim 1, wherein the first conductive layer has a lower resistivity than the second conductive layer.

4. The apparatus as recited in claim 1, wherein the parallel conductive lines form a capacitor coupled in parallel with the conductive loop.

5. The apparatus as recited in claim 1, wherein the first conductive layer has a first thickness at least twice a second thickness of the second conductive layer.

6. The apparatus as recited in claim 1, further comprising:
a serpentine gap in the first conductive layer, the serpentine gap being disposed between the first terminal and the second terminal and having a constant width.

7. The apparatus as recited in claim 1, wherein the at least one first conductive finger is parallel to the at least one second conductive finger and the at least one first conductive finger and the at least one second conductive finger each extend in a direction tangential to the conductive loop.

8. The apparatus as recited in claim 1, wherein the conductive loop forms at least a portion of an inductor.

9. The apparatus as recited in claim 1, further comprising:
an additional conductive loop formed from the first conductive layer, the additional conductive loop comprising a portion of the conductive loop or the first and second terminals.

10. A method of manufacturing an integrated circuit comprising:
forming a conductive loop from a first conductive layer, the conductive loop comprising a first terminal and a second terminal, the first terminal comprising at least one first conductive finger in the first conductive layer, and the second terminal comprising at least one second conductive finger in the first conductive layer, the at least one second conductive finger being interdigitated with the at least one first conductive finger without directly contacting the at least one first conductive finger;
forming at least one first conductive via coupled to a second conductive layer and coupled to the at least one first conductive finger, respectively;
forming at least one second conductive via coupled to the second conductive layer and coupled to the at least one second conductive finger, respectively; and
forming a first conductive structure in the second conductive layer and coupled to the at least one second conductive via; and forming a second conductive structure in the second conductive layer and coupled to the at least one second conductive via, wherein the first conductive structure and the second conductive structure are parallel conductive lines extending approximately radially with respect to a center of the conductive loop.

11. The method as recited in claim 10, wherein forming the conductive loop forms a serpentine gap having a constant width in the first conductive layer and being disposed between the first terminal and the second terminal.

12. The method as recited in claim 10, further comprising:
forming the second conductive layer, the second conductive layer being disposed between a substrate and the first conductive layer.

13. The method as recited in claim 10, wherein the first conductive layer has a resistivity less than the resistivity of the second conductive layer.

14. An integrated circuit formed by the method recited in claim 10.

15. The apparatus, as recited in claim 1, further comprising:
an additional conductive structure formed in the second conductive layer and coupled to the at least one first conductive finger by an additional conductive via, the additional conductive structure and the first conductive structure being disposed in positions alternating with the second conductive structure.

16. The method, as recited in claim 10, further comprising:
forming an additional conductive structure in the second conductive layer and coupled to the at least one first conductive finger by an additional conductive via, the additional conductive structure and the first conductive structure being disposed in positions alternating with the second conductive structure.

17. The apparatus, as recited in claim 1, wherein the conductive loop is included in a multi-loop inductor and the first terminal and the second terminal adjoin the conductive loop and a second conductive loop of the multi-loop inductor.

18. The apparatus, as recited in claim 1, wherein the conductive loop is included in a dual-loop inductor and the first terminal and the second terminal are disposed at a first end of the dual-loop inductor.

19. The method, as recited in claim 10, wherein the conductive loop is included in a multi-loop inductor and the first terminal and the second terminal adjoin the conductive loop and a second conductive loop of the multi-loop inductor.

20. The method, as recited in claim 10, wherein the conductive loop is included in a dual-loop inductor and the first terminal and the second terminal are disposed at a first end of the dual-loop inductor.

* * * * *